United States Patent
Kato et al.

(10) Patent No.: US 6,788,158 B2
(45) Date of Patent: Sep. 7, 2004

(54) PIEZOELECTRIC OSCILLATOR, METHOD OF PRODUCING THE SAME, AND ELECTRONIC DEVICE USING THE PIEZOELECTRIC OSCILLATOR

(75) Inventors: Akira Kato, Takatsuki (JP); Makoto Fujita, Kusatsu (JP); Akiyoshi Kinoshita, Komatsu (JP); Ikuo Tamaru, Hikone (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/953,719

(22) Filed: Sep. 17, 2001

(65) Prior Publication Data

US 2002/0050867 A1 May 2, 2002

(30) Foreign Application Priority Data

Oct. 26, 2000 (JP) .................................... 2000-327085

(51) Int. Cl.$^7$ .............................................. H03B 5/32
(52) U.S. Cl. .................................. 331/116 R; 331/176
(58) Field of Search ........................... 331/69, 70, 158, 331/176, 177 R, 116 R, 116 FE, 177 V, DIG. 3, 18, 108 C

(56) References Cited

U.S. PATENT DOCUMENTS

| | | | | |
|---|---|---|---|---|
| 3,322,981 A | * | 5/1967 | Brenig | 310/315 |
| 3,525,055 A | * | 8/1970 | Karol | 331/116 R |
| 3,806,831 A | * | 4/1974 | Kleinberg | 331/108 A |
| 4,088,968 A | * | 5/1978 | Pradal et al. | 332/124 |
| 4,851,792 A | * | 7/1989 | Ochiai et al. | 331/158 |
| 5,081,431 A | * | 1/1992 | Kubo et al. | 331/158 |
| 5,631,609 A | * | 5/1997 | Oka et al. | 29/25.35 |
| 6,147,565 A | * | 11/2000 | Satoh et al. | 219/210 |

FOREIGN PATENT DOCUMENTS

JP 07-099411 4/1995

* cited by examiner

*Primary Examiner*—Minh Nguyen
(74) *Attorney, Agent, or Firm*—Keating & Bennett, LLP

(57) ABSTRACT

A piezoelectric oscillator includes a piezoelectric element, and an oscillation circuit connected to one of two terminals of the piezoelectric element. One terminal of first capacitance element of which the other terminal is grounded is connected to at least one of the two terminals of the piezoelectric element. A series circuit including a resistor, which has adjustable resistance, can be adjusted and a second capacitance element is connected in parallel to the first capacitance element.

8 Claims, 4 Drawing Sheets

PIEZOELECTRIC OSCILLATOR, METHOD OF PRODUCING THE SAME, AND ELECTRONIC DEVICE USING THE PIEZOELECTRIC OSCILLATOR

BACKGROUND OF THE INVENTION

1. Field of the Invention

The present invention relates to a piezoelectric oscillator, a method of manufacturing such a piezoelectric oscillator, and an electronic device including such a piezoelectric oscillator and more particularly, the present invention relates to a piezoelectric oscillator, e.g., for use in a mobile communication device, a method of manufacturing such a piezoelectric oscillator, and an electronic device including such a piezoelectric oscillator.

2. Description of the Related Art

The oscillation frequency of each piezoelectric oscillator is determined by the resonance frequency of a piezoelectric resonator and a combined capacitance, which is equal to the sum of capacitance components connected to the piezoelectric resonator. The resonance frequency and the combined capacitance are designed so as to output a predetermined oscillation frequency. However, a problem arises in that when heat is applied to the piezoelectric resonator during a soldering process or other process during assemblage, thermal hysteresis causes the resonance frequency of the piezoelectric resonator to change, so that the oscillation frequency of the piezoelectric oscillator deviates from the designed value.

Accordingly, in conventional piezoelectric oscillators, a trimmer capacitor connected to a piezoelectric resonator is provided to correct the deviation from the oscillation frequency that is caused by the thermal hysteresis. In particular, the trimmer capacitor is adjusted so that the frequency corresponding to the deviation from the oscillation frequency can be corrected. Thus, the combined capacitance of the piezoelectric oscillator is changed so that the oscillation frequency is equal to the designed value. Examples of the trimmer capacitor include a rotational drive type trimmer capacitor including a rotor electrode, a stator electrode, and a dielectric sandwiched between the rotor and stator electrodes, a laser trimmer capacitor in which a part of an electrode disposed on a substrate is cut two-dimensionally by a laser (a part of the plane is removed). Generally, the size of the rotational drive type trimmer capacitor is about 3 mm in width×3 mm in length. The size of the laser trimmer capacitor is about 3 mm in width×5 mm in length.

The conventional piezoelectric oscillator is disclosed, e.g., in Japanese Unexamined Patent Application Publication No. 7-99411.

The capacitance of the rotational drive type trimmer capacitor is determined by setting the position of the rotor electrode relatively to the stator electrode. Thus, a problem arises in that the capacitance is changed by impact, which may be caused by falling and other external forces. Moreover, the rotational drive type trimmer capacitor has a rotation mechanism to determine the position of the stator electrode relative to the rotor electrode. Thus, a problem arises in that the area occupied by the circuit substrate is large, and reduction in size of the piezoelectric oscillator containing the rotational drive type trimmer capacitor is impossible. Also, problematically, the rotational drive type trimmer capacitor is very expensive. Reduction in cost of the piezoelectric oscillator using the rotational drive type trimmer capacitor can not be achieved.

The capacitance of the laser trimmer capacitor can be easily determined by burning-cutting the capacitor in a predetermined position thereof. Thus, no problem arises with the capacitance deviating due to impact caused by falling or other applied force. However, the area occupied by the circuit substrate is large, since the circuit substrate is required to have a plane for use in burning-cutting by the laser. Thus, the size of the piezoelectric oscillator using the laser trimmer capacitor can not be reduced.

SUMMARY OF THE INVENTION

In order to overcome the problems described above, preferred embodiments of the present invention provide a piezoelectric oscillator having a greatly reduced size and cost, and an electronic device including such a piezoelectric oscillator and having a greatly reduced size and cost.

Also, other preferred embodiments of the present invention provide a method of producing a piezoelectric oscillator by which the piezoelectric oscillator can be efficiently produced.

According to a preferred embodiment of the present invention, a piezoelectric oscillator includes a piezoelectric resonator, an oscillation circuit connected to the piezoelectric resonator, a first capacitance element having a first terminal that is grounded and a second terminal that is connected to at least one terminal of the piezoelectric resonator, and a series circuit including a resistor of which the resistance can be adjusted and a second capacitance element connected in parallel to the first capacitance element.

Preferably, one terminal of the resistor is grounded, and the other terminal is connected to the second capacitance element.

Preferably, the piezoelectric oscillator in accordance with a preferred embodiment of the present invention further includes a temperature compensation circuit connected to the piezoelectric oscillator resonator.

Preferably, the piezoelectric oscillator in accordance with a preferred embodiment of the present invention further includes a variable-capacitance diode having one terminal that is connected to the piezoelectric resonator.

Also, preferably, the first capacitance element includes the variable capacitance diode.

Preferably, the resistor is capable of being trimmed by a laser or other suitable process.

Also, preferably, the resistor is a thick-film resistor.

Also, according to a preferred embodiment of the present invention, a method of producing a piezoelectric oscillator including a resistor for adjustment of the frequency thereof, includes the steps of printing the circuit elements of a resonance circuit including the resistor on a circuit substrate, mounting a circuit element on the circuit substrate, and trimming the resistor using a laser.

Also, according to a preferred embodiment of the present invention, a method of producing a piezoelectric oscillator including a resistor for adjustment of the frequency thereof, including the steps of printing circuit elements on a circuit substrate, mounting circuit elements for a resonance circuit including the resistor on the circuit substrate, and trimming the resistor using a laser.

According to another preferred embodiment of the present invention, an electronic device includes at least one piezoelectric oscillator according to the preferred embodiments described above.

Also, according to another preferred embodiment of the present invention, an electronic device which includes at least one piezoelectric oscillator produced by the above-described method of producing a piezoelectric oscillator.

The combined capacitance of the piezoelectric oscillator in accordance with preferred embodiments of the present invention can be changed by changing the resistance, so that the oscillation frequency can be adjusted. Accordingly, the piezoelectric oscillator achieves significant reductions in size and cost, since a trimmer capacitor does not need to be used.

According to the method of producing a piezoelectric oscillator of preferred embodiments of the present invention, a process for adjusting the resistance, is preferably performed by trimming using a laser. Thus, efficient production of the piezoelectric oscillator is achieved.

An electronic device in accordance with a preferred embodiment of the present invention includes the piezoelectric oscillator in accordance with other preferred embodiments of the present invention, having greatly reduced size and cost. Thus, the size and cost of the electronic device is greatly reduced.

Other features, elements, characteristics and advantages of the present invention will become more apparent from the following detailed description of preferred embodiments with reference to the attached drawings.

DETAILED DESCRIPTION OF PREFERRED EMBODIMENTS

Figure 1:
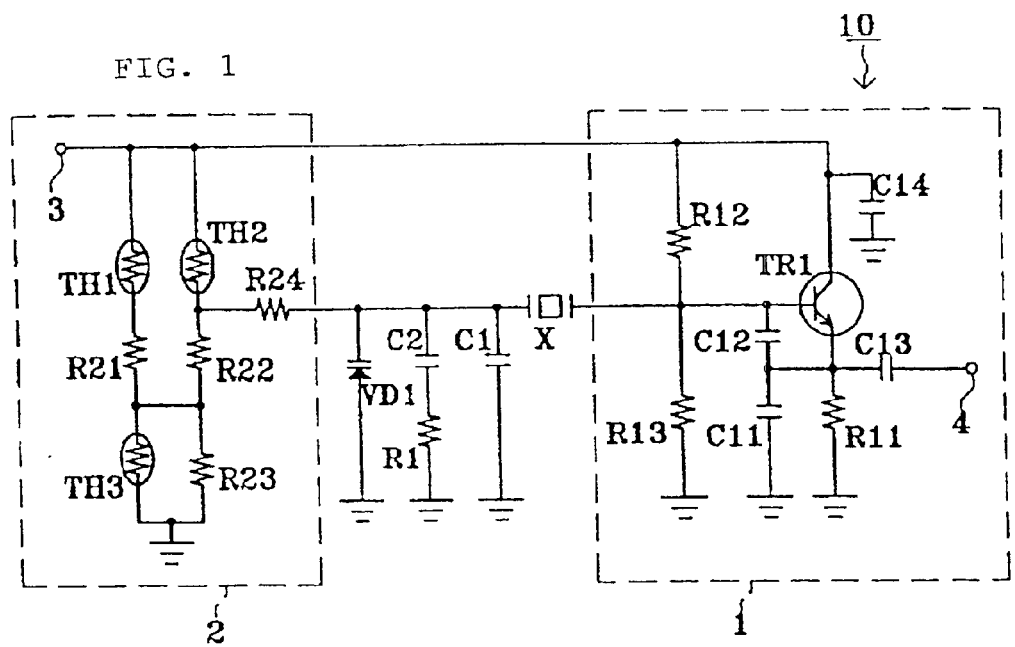
FIG. 1 is a circuit diagram of a piezoelectric oscillator according to a preferred embodiment of the present invention.

FIG. 1 is a circuit diagram of a piezoelectric oscillator according to a preferred embodiment of the present invention. In FIG. 1, a piezoelectric oscillator 10 according to a preferred embodiment of the present invention includes an oscillation circuit 1, a crystal resonator X which is a piezoelectric resonator, a temperature compensation circuit 2, a variable capacitance diode VD1 which is a variable capacitor element, capacitors C1 and C2, and a thick-film resistor R1 of which the resistance can be adjusted by laser-trimming. The oscillation circuit 1 includes a transistor TR1 which is an NPN transistor, thick-film resistors R11, R12, and R13, and capacitors C11, C12, C13, and C14. The temperature compensation circuit 2 outputs to the variable capacitance diode VD1 an output voltage corresponding to the temperature-frequency characteristic of the crystal resonator X. The temperature compensation circuit 2 includes resistors R21, R22, R23, and R24 of which the resistances can be adjusted by laser-trimming, and thermistors TH1, TH2, and TH3 which are temperature-sensitive resistor elements.

The oscillation circuit 1 is connected to one terminal of the crystal resonator X. The other terminal of the crystal resonator X is connected to one terminal of the capacitor C1 of which the other terminal is grounded. One terminal of the thick-film resistor R1 is grounded, and the other terminal is connected to one terminal of the capacitor C2. The other terminal of the capacitor C2 is connected to the other terminal of the crystal resonator X. The anode of the variable capacitance diode VD1 is grounded, and the cathode is connected to the other terminal of the crystal resonator X and one terminal of the resistor 24.

In the oscillation circuit 1, the collector of the transistor TR1 is grounded via the capacitor C14 and moreover is connected to a power source terminal 3. The base of the transistor TR1 is connected to the power source terminal 3 via the thick-film resistor R12, is grounded via the thick-film resistor R13, and moreover, is connected to the one terminal of the crystal resonator X that is a piezoelectric resonator and one terminal of the capacitor C12. The emitter of the transistor TR1 is connected to an output terminal 4 via the capacitor C13, is grounded via the thick-film resistor R11 and the high frequency by-pass capacitor C11, and is connected to the other terminal of the capacitor C12.

In the temperature compensation circuit 2, one terminal of each of the thermistors TH1 and TH2 is connected to the power source terminal 3, the other terminal of the thermistor TH1 is connected to one terminal of the resistor R21, the other terminal of the thermistor TH2 is connected to one terminal of the resistor R22 and the other terminal of the resistor R24. The other terminal of the resistor R21 is grounded via the thermistor TH3. The other terminal of the resistor R22 is grounded via the resistor R23, and moreover, is connected to the other terminal of the resistor R21.

In the piezoelectric oscillator 10 having the above-described configuration according to a preferred embodiment of the present invention, the capacitor C2 constitutes a second capacitance element. The capacitor C1 and the variable capacitance diode VD1, which are connected in parallel to the series circuit including the thick-film resistor R1 and the capacitor C2, respectively, constitute a first capacitance element. In the piezoelectric oscillator 10, the transistor TR1 and the capacitors C11 and C12 of the oscillation circuit 1, and the crystal resonator X constitute a Colpitts circuit. Moreover, in the piezoelectric oscillator 10, the variable capacitance diode VD1 to which the temperature compensation circuit 2 is connected is connected to the other terminal of the crystal resonator X to define an indirect compensation type piezoelectric oscillator.

The piezoelectric oscillator 10 is preferably formed by printing or mounting the above-described circuit elements or circuit parts such a crystal resonator, capacitors, resistors, and so forth onto a ceramic circuit substrate.

Hereinafter, a method of producing the piezoelectric oscillator in accordance with another preferred embodiment of the present invention will be described. The method of producing the piezoelectric oscillator 10 according to a preferred embodiment of the present invention preferably includes the following first to third steps.

In the first step, a ceramic substrate which is a material that is preferably used for production of the piezoelectric oscillator 10 is prepared. A circuit pattern including the circuit elements used to form the resonance circuit, and the thick-film resistor R1 for adjusting the frequency are printed.

In the second step, a circuit element such as the crystal resonator X or other suitable component is soldered so as to be mounted onto the ceramic circuit substrate. Heat that evolves during the soldering produces a thermal hysteresis in the crystal resonator X, which changes the resonance frequency of the crystal resonator X. The resistors R21, R22, R23, and R24 are trimmed by a laser for fine adjustment. Thus, the temperature-voltage characteristic of the temperature compensation circuit 2 is finely and accurately adjusted.

In the third step, the thick-film resistor R1 is trimmed by a laser for adjustment of the resistance so that the deviation of the oscillation frequency caused by the thermal hysteresis of the crystal resonator X is corrected to make the oscillation frequency coincide with the designed value.

According to the method of producing a piezoelectric oscillator of this preferred embodiment of the present invention, the laser trimming applied to the thick-film resistor R1 in the third step is preferably the same as the laser trimming used in the second step. Thus, the same apparatus can be used, and the piezoelectric oscillator can be efficiently produced.

Figure 2:
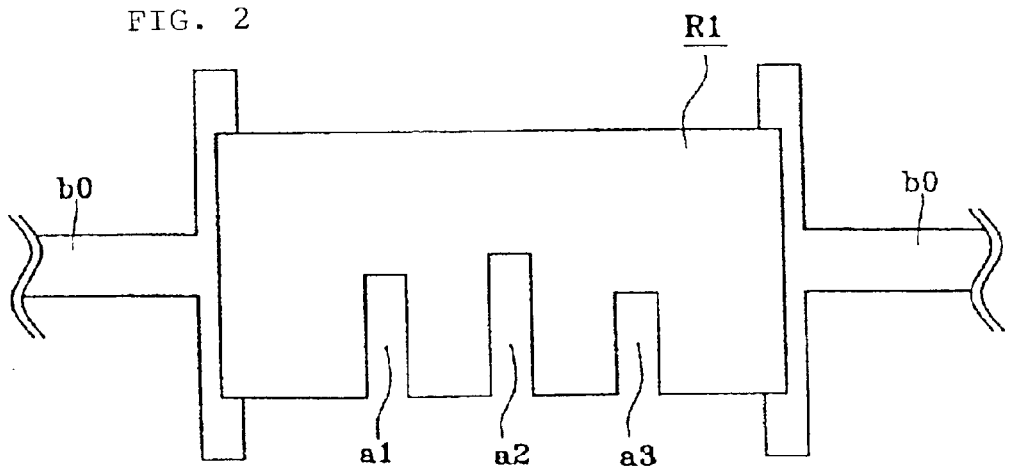
FIG. 2 is a plan view of a thick-film resistor R1 of the piezoelectric oscillator of FIG. 1.

FIG. 2 is a plan view of the thick-film resistor R1 after the laser trimming is performed. As shown in FIG. 2, the thick-film resistor R1 is connected to a circuit pattern b0. The thick-film resistor R1 has a size of about 0.2 mm in width×0.7 mm in length. The size is much smaller than that of the trimmer capacitor. The thick-film resistor R1 is trimmed by a laser linearly (one-dimensionally) at predetermined positions and results in cuts a1, a2, and a3 being formed.

Figure 3:
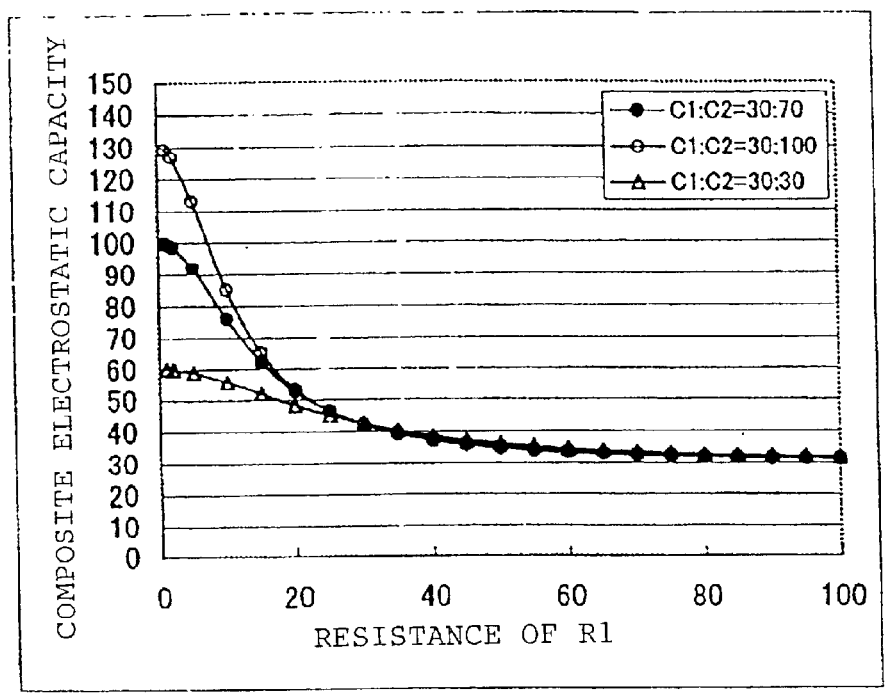
FIG. 3 is a graph showing a relationship between an adjustment amount of the thick-film resistor R1 and the combined capacitance of the piezoelectric oscillator.

FIG. 3 shows relationships between the resistances of the thick-film resistor R1 and the combined capacities of the piezoelectric oscillator 10 measured at predetermined frequencies. In FIG. 3, the resistance of the thick-film resistor R1 is plotted as the abscissa, and the combined capacitance of the piezoelectric oscillator, that is, the combined capacitance of the capacitance components connected to the other terminal of the crystal resonator X, which are the capacitor C1, the thick-film resistor R1, the capacitor C2, and the variable capacitance diode VD1. In FIG. 3, the curve passing through the black circular marks shows the relationship between the resistance of the thick-film resistor R1 and the combined capacitance of the piezoelectric oscillator 10, measured at a capacitance ratio of C1 to C2 of 30:70. The curve passing through the white circular marks shows the relationship measured at a capacitance ratio of C1 to C2 of 30:100. Moreover, the curve passing through the triangular marks shows the relationship measured at a capacitance ratio of C1 to C2 of 30:30. As seen in FIG. 3, according to the method of producing a piezoelectric oscillator of a preferred embodiment of the present invention, the oscillation frequency can be adjusted at a predetermined adjustment sensitivity. For example, when the resistance of the R1 is adjusted at a capacitance ratio of C1 to C2 of 30:70, resulting in excessively steep changed in the combined capacitance, the ratio of C1 to C2 may be changed to 30 : 30 to make the change very gradual and small. When the change of the combined capacitance is excessively small, the ratio of C1 to C2 may be changed to 30:100 so that the change of the combined capacitance is made steep.

In particular, according to the method of producing a piezoelectric oscillator of the present preferred embodiment of the present invention, the combined capacitance is determined by the impedance of the resistor R1, the capacitors C1 and C2, and the variable capacitance diode VD1. The change of the combined capacitance can be made steep or gradual by changing the impedance of the capacitors C1 and C2 and the variable capacitance diode VD1 relatively to the impedance of the thick-film resistor R1. That is, the oscillation frequency can be adjusted at a predetermined sensitivity.

The change of the combined capacitance can be also made steep or gradual by changing the impedance of the variable capacitance diode VD1 relatively to the impedance of the thick-film resistor R1 while the capacities of the capacitors C1 and C2 are maintained on a constant level. Thus, the oscillation frequency can be adjusted at a predetermined sensitivity.

Moreover, the oscillation frequency of the piezoelectric oscillator 10 can be adjusted by changing the resistance of the thick-film resistor R1 as a resistor component, without a capacitance component such as a trimmer capacitor being directly changed. Accordingly, the piezoelectric oscillator 10 can be greatly reduced in size and cost, since a trimmer capacitor is not required.

Moreover, the oscillation frequency of the piezoelectric oscillator 10 according to a preferred embodiment of the present invention can be adjusted with such high accuracy which can not be attained by the trimmer capacitor, for example, with an accuracy of ±0.5 ppm by setting the relative impedance of the thick-film resistor R1, the capacitors C1 and C2, and the variable capacitance diode VD1 at a predetermined value.

Referring to the series circuit of the thick-film resistor R1 and the capacitor C2, the thick-film resistor R1 is arranged on the side where the electric potential is low, that is, on the side near the ground in the piezoelectric circuit 10. For this reason, the stray capacitance can be prevented from changing, even if the resistance of the thick-film resistor R1 is adjusted. Thus, such capacitance coupling can be prevented from being difficult to predict and control.

According to a method of producing a piezoelectric oscillator of a preferred embodiment of the present invention, a chip resistor for adjustment of the frequency which is a circuit component that is equivalent to the thick-film resistor R1 may be soldered onto the ceramic circuit substrate in the second step, instead of printing the thick-film resistor R1 in the first step of the above-described preferred embodiment. Desirably, the chip resistor is capable of being trimmed by a laser or other suitable device.

According to the method of producing a piezoelectric oscillator of a preferred embodiment of the present invention, the resistances of the resistors may be adjusted by sandblasting instead of laser-trimming.

In the above-described preferred embodiment, the capacitor C1 and the variable capacitance diode VD1 constitute the first capacitance element. The first capacitance element may include the variable capacitance diode VD1 with the capacitor C1 being omitted.

Figure 4:
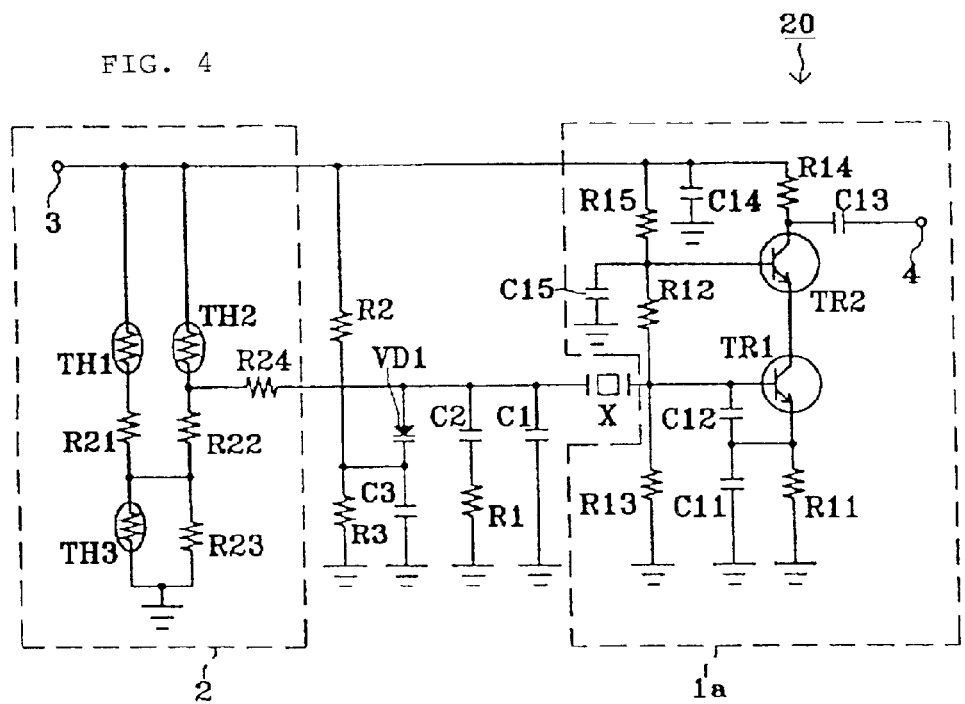
FIG. 4 is a circuit diagram of a piezoelectric oscillator according to another preferred embodiment of the present invention.

FIG. 4 is a circuit diagram of a piezoelectric oscillator according to another preferred embodiment of the present invention. In FIG. 4, the same or equivalent components to those shown in FIG. 1 are designated by the same reference numerals, and the repeated description is omitted. In contrast to the piezoelectric oscillator 10, a piezoelectric oscillator 20 includes an oscillation circuit 1a instead of the oscillation circuit 1, and moreover, includes resistors R2 and R3 and a capacitor C3.

As shown in FIG. 4, the oscillation circuit 1a includes a transistor TR2, resistors R14 and R15, and a capacitor C15 in addition to the configuration of the oscillation circuit 1. The collector of the transistor TR1 is connected to the emitter of the transistor TR2. The base of the transistor TR1 is connected to the power source terminal 3 via the resistors R12 and R15. The base of the transistor TR2 is grounded via the capacitor C15, and also, is connected to the power source terminal 3 via the resistor R15. The collector of the transistor TR2 is connected to the power source terminal 3 via the resistor 14, and also, is connected to the output terminal 4 via the capacitor C13. One terminal of the resistor R2 is connected to the power source terminal 3, and the other terminal is connected to one terminal of the resistor R3 and also to the cathode of the variable capacitance diode VD1. The anode of the variable capacitance diode VD1 is connected to the other terminal of the crystal resonator X. The other terminal of the resistor R3 is grounded.

In the above-described configuration of the piezoelectric oscillator 20, the capacitors C1 and C3 and the variable capacitance diode VD1 constitute a first capacitance element, and the capacitor C2 constitutes a second capacitance element.

The combined capacitance of the piezoelectric oscillator 20 is determined by the impedance of the thick-film resistor R1, the capacitors C1, C2, and C3, and the variable capacitance diode VD1. Accordingly, the combined capacitance of the piezoelectric oscillator 20 can be changed by changing the resistance of the thick-film resistor R1 defining a resistor component.

Moreover, in the piezoelectric oscillator 20, the transistor TR2 having a buffer-amplification function is provided in the oscillation circuit 1a. Therefore, the oscillation circuit 1a can continue to oscillate with high stability, without being affected by variations in the voltage and the load of the next stage.

Figure 5:
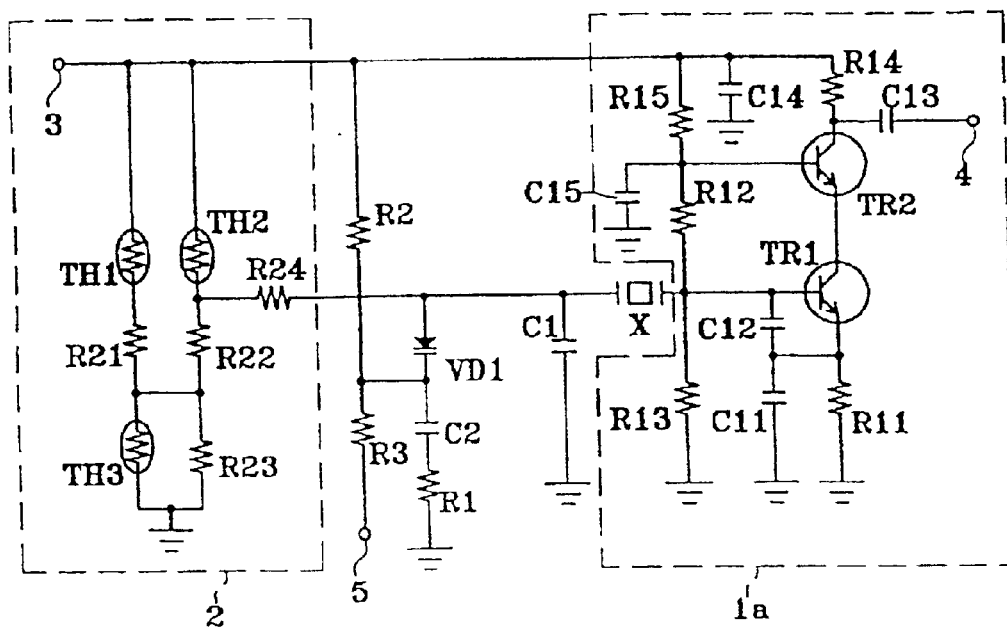
FIG. 5 is a circuit diagram of a piezoelectric oscillator according to yet another preferred embodiment of the present invention.

FIG. 5 is a circuit diagram of a piezoelectric oscillator according to yet another preferred embodiment of the present invention. In FIG. 5, the same or equivalent parts to those in FIG. 4 are designated by the same reference numerals, and the repeated description is omitted. A piezoelectric oscillator 30 is different from the piezoelectric oscillator 20 in that the other terminal of the resistor R3 is not grounded but is connected to a control terminal 5. The series circuit including the capacitor C2 and the thick-film resistor R1 is connected to the cathode of the variable capacitance diode VD1.

In the piezoelectric oscillator 30 having the unique configuration as described above, the capacitor C1 constitutes a first capacitance element, and the capacitor C2 and the variable capacitance diode VD1 constitute a second capacitance element.

The combined capacitance of the piezoelectric oscillator 30 is determined by the thick-film resistor R1, the capacitors C1 and C2, and the variable capacitance diode VD1. Therefore, the combined capacitance of the piezoelectric oscillator 30 can be changed by changing the resistance of the thick-film resistor R1 defining a resistor component.

Moreover, in the piezoelectric oscillator 30, the difference between a predetermined control voltage input via the control terminal 5 and the voltage of the power source is divided between the resistor R2 and the resistor R3, and is applied to the cathode of the variable capacitance diode VD1. Accordingly, the capacitance of the variable capacitance diode VD1 can be finely controlled by adjustment of the control voltage. Thus, a signal output from the piezoelectric oscillator can be finely controlled.

Figure 6:
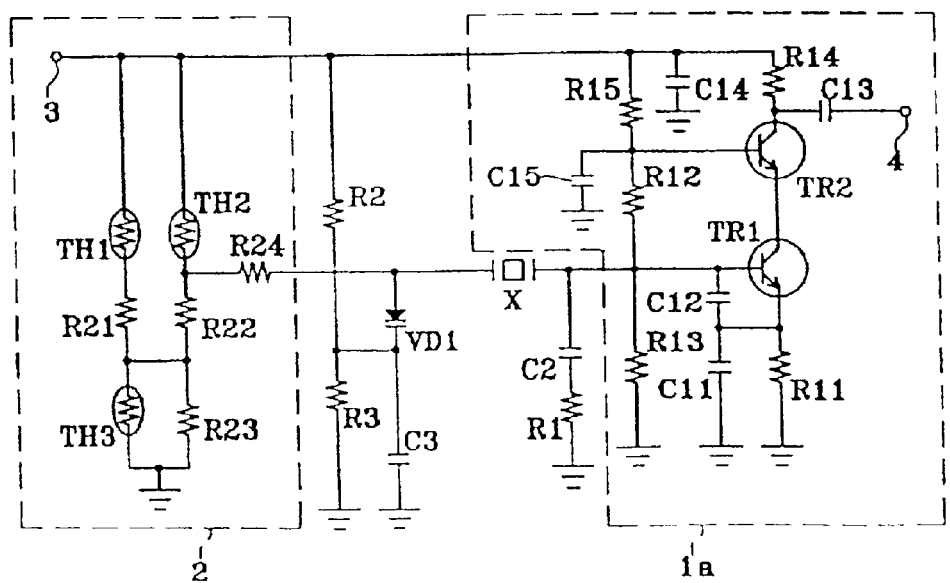
FIG. 6 is a circuit diagram of a piezoelectric oscillator according to still another preferred embodiment of the present invention.

FIG. 6 is a circuit diagram of a piezoelectric oscillator according to still another preferred embodiment of the present invention. In FIG. 6, the same or equivalent parts to those of the piezoelectric oscillator 20 shown in FIG. 4 are designated by the same reference numerals, and the repeated description is omitted. The piezoelectric oscillator 40 is different from the piezoelectric oscillator 20 in that the series circuit including the capacitor C2 and the thick-film resistor R1 is connected to the one terminal of the crystal resonator X, and moreover, the capacitor C1 is not provided.

In the piezoelectric oscillator 40 configured as described above, the capacitors C11 and C12 constitute a first capacitance element, and the capacitor C2 constitutes a second capacitance element.

The combined capacitance of the piezoelectric oscillator 40 is determined by the impedance of the thick-film resistor R1 and the capacitors C2, C11, and C12. Thus, the combined capacitance of the piezoelectric oscillator 40 can be changed by changing the resistance of the thick-film resistor R1 as a resistor component.

Figure 7:
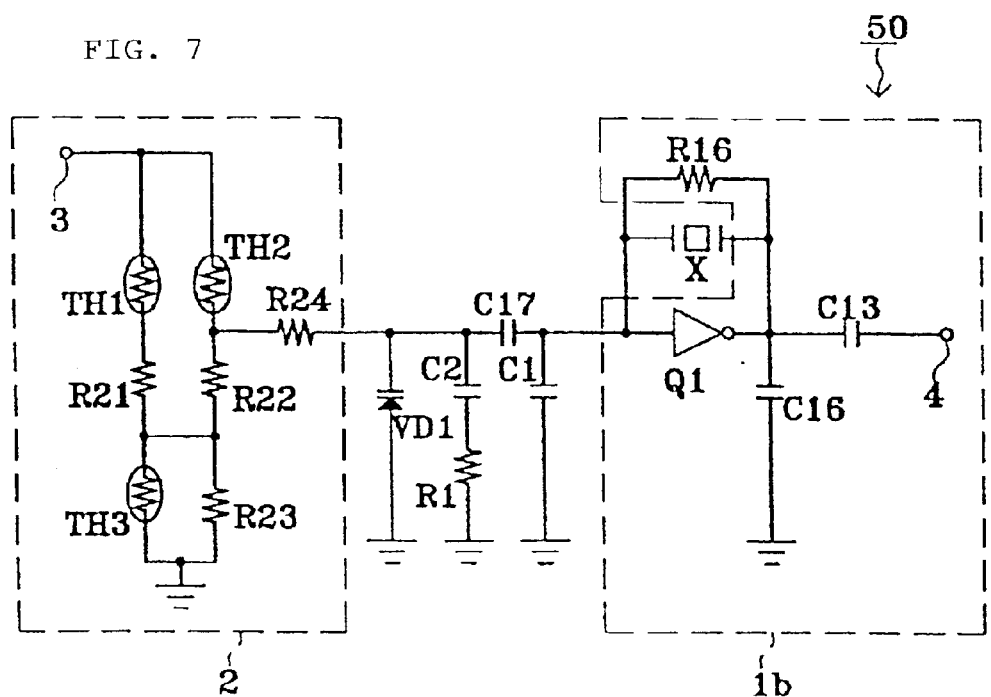
FIG. 7 is a circuit diagram of a piezoelectric oscillator according to another preferred embodiment of the present invention.

FIG. 7 is a circuit diagram of a piezoelectric oscillator according to another preferred embodiment of the present invention. In FIG. 7, the same or equivalent parts to those in the piezoelectric oscillator 10 of FIG. 1 are designated by the same reference numerals, and the repeated description is omitted. A piezoelectric oscillator 50 is different from the piezoelectric oscillator 10 in that it contains an oscillation circuit 1b instead of the oscillation circuit 1, and also, includes a capacitor C17.

In FIG. 7, the oscillation circuit 1b of the piezoelectric oscillator 50 includes an inverter Q1, a resistor R16, and capacitors C13 and C16 to constitute an inverter oscillation circuit. A capacitor C17 is provided between the other terminal of the capacitor C1 and the other terminal of the capacitor C2.

In the piezoelectric oscillator 50 having the unique configuration as described above, the capacitor C17 is applied to block DC current, and has a very high and large capacitance. Thus, the impedance can be ignored. Therefore, in the piezoelectric oscillator 50, the capacitor C1 and the variable capacitance diode VD1 constitute a first capacitance element, and the capacitor C2 constitutes a second capacitance element.

The combined capacitance of the piezoelectric oscillator 50 is determined by the impedance of the thick-film resistor R1, the capacitors C1 and C2, and the variable capacitance diode VD1. Therefore, the combined capacitance of the piezoelectric oscillator 50 can be changed by changing the resistance of the thick-film resistor R1 defining a resistor component.

In the above-described preferred embodiments, the temperature compensation circuit including a thermistor network is described. The temperature compensation circuit is not limited to the thermistor network. For example, the network may be used, in which the temperature-frequency characteristic of the crystal resonator is recorded in a digital memory, and a voltage which cancels out the frequency-temperature characteristic of the crystal resonator corresponding to the ambient temperature is generated by use of a D/A converter and a function generator.

In the above-described preferred embodiments, the description refers to the Colpitts oscillation circuit and the inverter oscillation circuit. When Hartley, Clapp, and Pierce oscillation circuits are used, the same operation and effects as described above can be obtained. Moreover, in addition to oscillation circuits containing a bipolar transistor, oscillation circuits using a field effect transistor, a logic element such as CMOS or other suitable components present the same operation and effects. Moreover, the piezoelectric oscillator in accordance with preferred embodiments of the present invention present the same operation and effects, even if circuit elements, such as capacitors, inductors, or other elements, in addition to the resistors and the temperature-sensitive resistors, is incorporated into the temperature compensation circuit. Moreover, the piezoelectric resonator is not limited to the crystal resonator. Use of a surface acoustic wave resonator, a ceramic resonator utilizing bulk resonation, a lithium tantalate resonator, and a lithium niobate resonator also achieves the same operation and effects.

Figure 8:
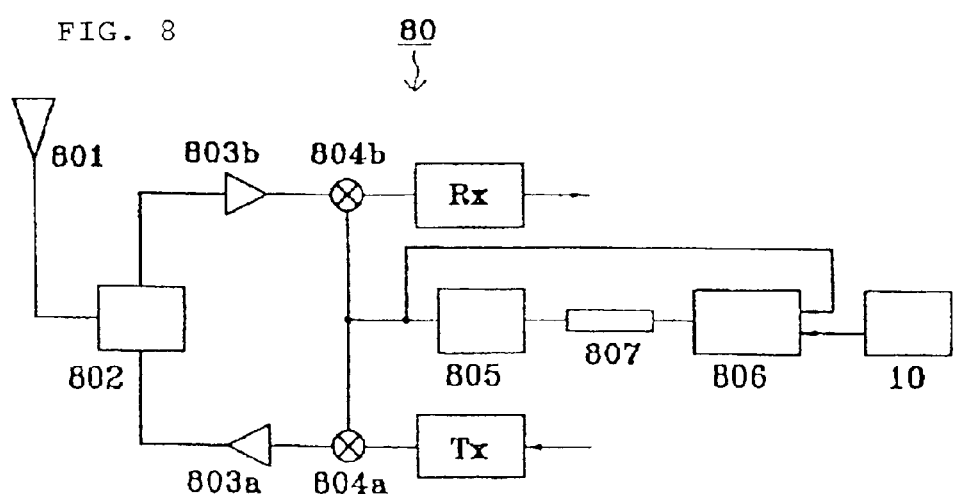
FIG. 8 is a block diagram of an electronic device according to a preferred embodiment of the present invention.

FIG. 8 is a block diagram of a communication device according to yet another preferred embodiment of the electronic device in accordance with the present invention.

A communication device 80 of FIG. 8 includes an antenna 801, a duplexer 802, amplification units 803a and 803b, mixing units 804a and 804b, a voltage control oscillator 805, a PLL circuit 806, a low-pass filter 807, the piezoelectric oscillator 10 according to another preferred embodiment of the present invention, a modulation unit Tx, and a demodulation unit Rx.

An output signal from the voltage control oscillator 805 is input to the PLL circuit 806, in which the frequency of the output signal is divided and then, the phase of the signal is compared with that of an oscillation signal from the piezoelectric oscillator 10. The PLL circuit 806 outputs a control voltage having a predetermined frequency and phase.

The voltage control oscillator 805 receives the control voltage via the low-pass filter 807, and outputs a high frequency signal corresponding to the control voltage. The high frequency signal is given as local oscillation signals to the mixing units 804a and 804b, respectively.

The mixing unit 804a mixes an intermediate frequency signal output from the modulation unit Tx with the local oscillation signal and converts it to a transmission signal. The transmission signal is amplified in the amplification unit 803a, and is radiated from the antenna 801 via the duplexer 802.

A reception signal from the antenna 801 is fed via the duplexer 802 and amplified in the amplification unit 803b. The mixing unit 804b mixes the reception signal amplified in the amplification unit 803b with the local oscillation signal from the voltage control oscillator 805 and converts it to an intermediate frequency signal. The intermediate frequency signal is detected in the demodulation unit Rx.

The communication device 80 of the above-described preferred embodiment includes the piezoelectric oscillator 10 that has a greatly reduced size and cost. Thus, the size and cost of the communication device are reduced.

The electronic device containing the piezoelectric oscillator in accordance with preferred embodiments of the present invention has been described with reference to the communication device 80. The electronic device of the present invention is not limited to the above-described communication device.

In the piezoelectric oscillator of preferred embodiments of the present invention, the combined capacitance of the entire resonance circuit is changed by changing the resistor for adjustment of the frequency provided in the resonance circuit. Thus, the oscillation frequency can be adjusted. Therefore, it is not necessary to use a trimmer capacitor. Thus, the piezoelectric oscillator of various preferred embodiments of the present invention is greatly reduced in size and cost.

According to the method of producing a piezoelectric oscillator in accordance with another preferred embodiment of the present invention, production of the piezoelectric oscillator is highly efficient, since the resistance is adjusted by trimming using a laser.

The electronic device of another preferred embodiment the present invention includes the piezoelectric oscillator in accordance with the present invention having a greatly reduced size and cost. Thus, the electronic device is also greatly reduced in size and cost.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method of producing a piezoelectric oscillator including a piezoelectric resonator having first and second terminals, an oscillation circuit connected to the piezoelectric resonator, a first capacitance element having a first terminal connected to ground and a second terminal connected one of the first and second terminals of the piezoelectric resonator, and a series circuit including a resistor and a second capacitance element connected in parallel to the first capacitance element, wherein the other of the first and second terminals of said piezoelectric resonator is connected to one of an input side and an output side of said oscillation circuit, the method comprising the steps of:

printing circuit elements for forming the series circuit including the resistor on a circuit substrate;

mounting additional circuit elements on the circuit substrate; and trimming the resistor using a laser.

2. A method of producing a piezoelectric oscillator according to claim 1, wherein the resistor is a thick-film resistor.

3. A method of producing a piezoelectric oscillator according to claim 1, wherein the oscillation circuit includes a transistor, thick-film resistors, and capacitors.

4. A method of producing a piezoelectric oscillator according to claim 1, further comprising a temperature compensation circuit connected to the piezoelectric resonator, wherein the temperature compensation circuit includes resistors having resistances that are adjusted by laser-trimming, and thermistors.

5. A method of producing a piezoelectric oscillator including a piezoelectric resonator having first and second terminals, an oscillation circuit connected to tile piezoelectric resonator, a first capacitance element having a first terminal connected to ground and a second terminal connected to one of the first and second terminals of the piezoelectric resonator, and a series circuit including a resistor and a second capacitance element connected in parallel to the first capacitance element, wherein the other of the first and second terminals of said piezoelectric resonator is connected to one of an input side and an output side of said oscillation circuit, the method comprising the steps of:

mounting circuit elements for forming the series circuit including the resistor on the circuit substrate;

printing additional circuit elements on the circuit substrate; and trimming the resistor by a laser.

6. A method of producing a piezoelectric oscillator according to claim 5, wherein the resistor is a thick-film resistor.

7. A method of producing a piezoelectric oscillator according to claim 5, wherein the oscillation circuit includes a transistor, thick-film resistors, and capacitors.

8. A method of producing a piezoelectric oscillator according to claim 5, further comprising a temperature compensation circuit connected to the piezoelectric resonator, wherein the temperature compensation circuit includes resistors having resistances that are adjusted by laser-trimming, and thermistors.

* * * * *